United States Patent
Jung et al.

(10) Patent No.: US 10,211,159 B2
(45) Date of Patent: *Feb. 19, 2019

(54) SEMICONDUCTOR PACKAGES HAVING SEMICONDUCTOR CHIPS DISPOSED IN OPENING IN SHIELDING CORE PLATE

(71) Applicant: SAMSUNG ELECTRONICS CO., LTD., Suwon-si (KR)

(72) Inventors: Yoonha Jung, Suwon-si (KR); Jongkook Kim, Hwaseong-si (KR); Bona Baek, Yongin-si (KR); Heeseok Lee, Yongin-si (KR); Kyoungsei Choi, Youngi-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 15/215,227

(22) Filed: Jul. 20, 2016

(65) Prior Publication Data

US 2016/0329285 A1 Nov. 10, 2016

Related U.S. Application Data

(63) Continuation of application No. 14/283,828, filed on May 21, 2014, now Pat. No. 9,425,156.

(30) Foreign Application Priority Data

Jul. 29, 2013 (KR) .................. 10-2013-0089665

(51) Int. Cl.
*H01L 23/538* (2006.01)
*H01L 23/00* (2006.01)
(Continued)

(52) U.S. Cl.
CPC ...... *H01L 23/5389* (2013.01); *H01L 23/3114* (2013.01); *H01L 23/49822* (2013.01);
(Continued)

(58) Field of Classification Search
CPC ..... H01L 2224/16227; H01L 23/49816; H01L 21/486; H01L 24/13; H01L 23/49822;
(Continued)

(56) References Cited

U.S. PATENT DOCUMENTS 6,175,497 B1 1/2001 Tseng et al.
6,828,687 B2 12/2004 Ding
(Continued)

FOREIGN PATENT DOCUMENTS

JP 2010-103519 6/2010
KR 1020100118884 10/2010
KR 1020120040039 4/2012

OTHER PUBLICATIONS

USPTO Office Action issued in parent U.S. Appl. No. 14/283,828 dated Feb. 6, 2015.
(Continued)

*Primary Examiner* — Khiem D Nguyen
(74) *Attorney, Agent, or Firm* — Sughrue Mion, PLLC

(57) ABSTRACT

A semiconductor package includes a first plate having a through hole therein, at least one interconnection layer disposed on a first surface of the first plate, and at least one semiconductor chip disposed on the at least one interconnection layer in a space defined by the through hole and electrically connected to the least one interconnection layer. The package further includes a second plate disposed on the at least one semiconductor chip and a second surface of the first plate on a side of the first plate opposite the first surface, and at least one conductive pad disposed on the second
(Continued)

surface of the first plate and electrically connected to the at least one interconnection layer.

20 Claims, 10 Drawing Sheets

(51) Int. Cl.
*H01L 25/10* (2006.01)
*H01L 23/552* (2006.01)
*H01L 23/31* (2006.01)
*H01L 23/498* (2006.01)

(52) U.S. Cl.
CPC ...... *H01L 23/5383* (2013.01); *H01L 23/5384* (2013.01); *H01L 23/5386* (2013.01); *H01L 23/552* (2013.01); *H01L 24/13* (2013.01); *H01L 24/16* (2013.01); *H01L 24/32* (2013.01); *H01L 24/73* (2013.01); *H01L 25/105* (2013.01); *H01L 23/49816* (2013.01); *H01L 24/29* (2013.01); *H01L 24/33* (2013.01); *H01L 24/48* (2013.01); *H01L 24/83* (2013.01); *H01L 2224/131* (2013.01); *H01L 2224/16225* (2013.01); *H01L 2224/16227* (2013.01); *H01L 2224/2919* (2013.01); *H01L 2224/3224* (2013.01); *H01L 2224/32145* (2013.01); *H01L 2224/32225* (2013.01); *H01L 2224/32245* (2013.01); *H01L 2224/33181* (2013.01); *H01L 2224/48091* (2013.01); *H01L 2224/48105* (2013.01); *H01L 2224/48227* (2013.01); *H01L 2224/49113* (2013.01); *H01L 2224/73204* (2013.01); *H01L 2224/73215* (2013.01); *H01L 2224/73253* (2013.01); *H01L 2224/73265* (2013.01); *H01L 2224/8385* (2013.01); *H01L 2224/83101* (2013.01); *H01L 2224/83424* (2013.01); *H01L 2224/83444* (2013.01); *H01L 2224/83447* (2013.01); *H01L 2224/83455* (2013.01); *H01L 2224/83471* (2013.01); *H01L 2225/0651* (2013.01); *H01L 2225/1035* (2013.01); *H01L 2225/1058* (2013.01); *H01L 2924/00014* (2013.01); *H01L 2924/15153* (2013.01); *H01L 2924/15311* (2013.01); *H01L 2924/181* (2013.01)

(58) Field of Classification Search
CPC ............. H01L 25/105; H01L 23/49827; H01L 23/5389; H01L 23/5384; H01L 23/5386; H01L 23/3114; H01L 24/16; H01L 24/32; H01L 2224/73204; H01L 2224/3224; H01L 2224/16225; H01L 2224/49113; H01L 2224/8385; H01L 2224/73265; H01L 2224/48105

See application file for complete search history.

(56) References Cited

U.S. PATENT DOCUMENTS

| | | | |
|---|---|---|---|
| 7,528,482 B2 | 5/2009 | Huang et al. | |
| 7,851,905 B2 | 12/2010 | Chrysler et al. | |
| 7,855,342 B2 | 12/2010 | Sakamoto et al. | |
| 8,093,704 B2 | 1/2012 | Palmer et al. | |
| 8,237,257 B2 | 8/2012 | Yang | |
| 8,264,849 B2 | 9/2012 | Guzek | |
| 8,319,318 B2 | 11/2012 | Nalla et al. | |
| 8,343,808 B2 | 1/2013 | Lin et al. | |
| 9,425,156 B2 * | 8/2016 | Jung | H01L 24/13 |
| 2005/0258548 A1 | 11/2005 | Ogawa et al. | |
| 2006/0191711 A1 | 8/2006 | Cho et al. | |
| 2006/0231949 A1 | 10/2006 | Park et al. | |
| 2008/0165515 A1 | 7/2008 | Hsu et al. | |
| 2008/0302560 A1 | 12/2008 | Tanno et al. | |
| 2009/0049686 A1 * | 2/2009 | Park | H01L 24/24 29/837 |
| 2009/0085185 A1 | 4/2009 | Byun et al. | |
| 2010/0084175 A1 * | 4/2010 | Suzuki | H01L 21/4857 174/260 |
| 2010/0134991 A1 * | 6/2010 | Kim | H01L 23/5389 361/762 |
| 2011/0156231 A1 | 6/2011 | Guzek | |
| 2011/0215464 A1 | 9/2011 | Guzek et al. | |
| 2011/0228464 A1 | 9/2011 | Guzek et al. | |
| 2011/0254124 A1 | 10/2011 | Nalla et al. | |
| 2011/0259630 A1 * | 10/2011 | Park | H01L 23/13 174/260 |
| 2011/0290540 A1 * | 12/2011 | Jung | H01L 23/13 174/255 |
| 2012/0161331 A1 | 6/2012 | Gonzalez et al. | |
| 2012/0217660 A1 | 8/2012 | Tani et al. | |
| 2014/0175624 A1 * | 6/2014 | Palm | H01L 21/50 257/666 |

OTHER PUBLICATIONS

USPTO Office Action issued in parent U.S. Appl. No. 14/283,828 dated Jul. 23, 2015.
USPTO Office Action issued in parent U.S. Appl. No. 14/283,828 dated Oct. 20, 2015.
USPTO Notice of Allowance issued in parent U.S. Appl. No. 14/283,828 dated Apr. 15, 2016.

* cited by examiner

SEMICONDUCTOR PACKAGES HAVING SEMICONDUCTOR CHIPS DISPOSED IN OPENING IN SHIELDING CORE PLATE

CROSS-REFERENCE TO RELATED APPLICATION

This is a continuation of U.S. application Ser. No. 14/283,828 filed May 21, 2014, issued as U.S. Pat. No. 9,425,156, which claims priority under 35 U.S.C. § 119 to Korean Patent Application No. 10-2013-0089665, filed on Jul. 29, 2013, in the Korean Intellectual Property Office, the disclosures of which are hereby incorporated by reference in their entirety.

BACKGROUND

The inventive concepts relate to semiconductor packages and, more particularly, to semiconductor packages including stacked semiconductor chip arrangements.

There is a trend in the electronic industry to inexpensively fabricate lighter, smaller, faster, more multi-functional, higher performance and higher reliability electronic products. Advanced packaging techniques used to fabricate such products are important for achieving this trend. Such advanced techniques include chip scale packaging (CSP) techniques. CSP techniques may provide a small semiconductor package at a semiconductor chip scale.

High capacity semiconductor packages are also in demand. However, techniques capable of integrating a lot of cells in a limited area are needed in order to increase memory capacity. These techniques may require techniques for creating accurate and fine widths and spaces and thus, may entail a long development time. Research is being conducted to produce processes for realizing high integration of semiconductor packages using recently developed semiconductor chip and semiconductor packages, for example, a multi-chip package including three-dimensionally arranged semiconductor chips and semiconductor package structures including three-dimensionally arranged semiconductor packages.

SUMMARY

Embodiments of the inventive concepts may provide semiconductor packages with reduced thicknesses and of increased reliability.

Some embodiments provide a semiconductor package including a core plate having first and second surfaces on opposite sides thereof and a through hole defined therein, at least one interconnection layer disposed on the second surface of the core plate and a first semiconductor chip disposed on the at least one interconnection layer in a space defined by the through hole and electrically connected to the least one interconnection layer. A chip pad is disposed on the first semiconductor chip and the first surface of the core plate and at least one ball pad is disposed on the first surface of the core plate and substantially coplanar with the chip pad.

The at least one ball pad may include a plurality of ball pads disposed around a periphery of the chip pad. In some embodiments, the chip pad may have substantially the same planar extent as the core plate and the at least one ball pad may include at least one ball pad exposed by an opening through the chip pad.

The chip pad may have substantially the same thickness as the at least one ball pad. The chip pad may include substantially the same material as the at least one ball pad.

The at least one ball pad may include at least one ground ball pad and at least one signal ball pad.

The semiconductor package may further include an adhesive layer bonding the chip pad to the first semiconductor chip.

The interconnection layer may include at least one insulating layer and at least one circuit pattern.

The semiconductor package may further include an insulating layer disposed between the core plate and the first semiconductor chip and between the chip pad and the at least one ball pad. The semiconductor package may further include at least one through via passing through the insulating layer and the core plate and electrically connecting the at least one ball pad to the interconnection layer.

The semiconductor package may further include a protection layer covering the chip pad and exposing the at least one ball pad.

The semiconductor package may further include at least one stack terminal disposed on the at least one ball pad and an upper package disposed on the chip pad and electrically connected to the at least one ball pad by the at least one stack terminal. The upper package may include a wiring board having a first surface facing the chip pad and electrically connected to the at least one ball pad by the at least one stack terminal and at least one second semiconductor chip mounted on a second surface of the wiring board and electrically connected to the wiring board. The first and second semiconductor chips may perform different functions.

The upper package may further include a molded layer covering the wiring board and the second semiconductor chip.

The semiconductor package may further include at least one dummy terminal disposed between the chip pad and the upper package.

According to further embodiments, a semiconductor package includes a first plate having a through hole therein, at least one interconnection layer disposed on a first surface of the first plate, and at least one semiconductor chip disposed on the at least one interconnection layer in a space defined by the through hole and electrically connected to the least one interconnection layer. The package further includes a second plate disposed on the at least one semiconductor chip and a second surface of the first plate on a side of the first plate opposite the first surface, and at least one conductive pad disposed on the second surface of the first plate and electrically connected to the at least one interconnection layer.

The at least one conductive pad may include at least one ground conductive pad electrically connected to the first plate. The at least one ground conductive pad may be electrically connected to the at least one interconnection layer by a conductive via passing through and electrically contacting the first plate.

The at least one conductive pad may include at least one conductive signal pad electrically insulated from the first plate. The at least one conductive signal pad may be electrically connected to the at least one interconnection layer by a conductive via passing through and insulated from the first plate.

In some embodiments, the at least one semiconductor chip may be flip chip mounted on the at least one interconnection layer.

The least one semiconductor chip may be mounted on a first side of the at least one interconnection layer and the at least one interconnection layer may include a plurality of conductive pads on an opposite second side of the at least one interconnection layer. The plurality of conductive pads on the second side of the at least one interconnection layer may be configured to support solder ball connection thereto.

The at least one conductive pad may be configured to support solder ball connection thereto.

The semiconductor package may further include a wiring board disposed on the second plate and electrically connected to the at least one interconnection layer via the at least one conductive pad.

Still further embodiments provide a semiconductor package including a plate having a through hole therein, at least one interconnection layer disposed on a first surface of the plate, and at least one semiconductor chip disposed on the at least one interconnection layer in a space defined by the through hole and electrically connected to the least one interconnection layer. At least one conductive pad is disposed on the second surface of the first plate and at least one via passes through the plate and electrically connects the at least one interconnection layer and the at least one conductive pad.

The at least one via may include at least one via passing through the plate and electrically insulated therefrom and/or at least one via passing through the plate and electrically connected thereto.

The plate may include a first plate and the semiconductor package may further include a second plate disposed on the at least one semiconductor chip and thermally bonded thereto.

BRIEF DESCRIPTION OF THE DRAWINGS

The inventive concepts will become more apparent in view of the attached drawings and accompanying detailed description.

DETAILED DESCRIPTION

Figure 1A:
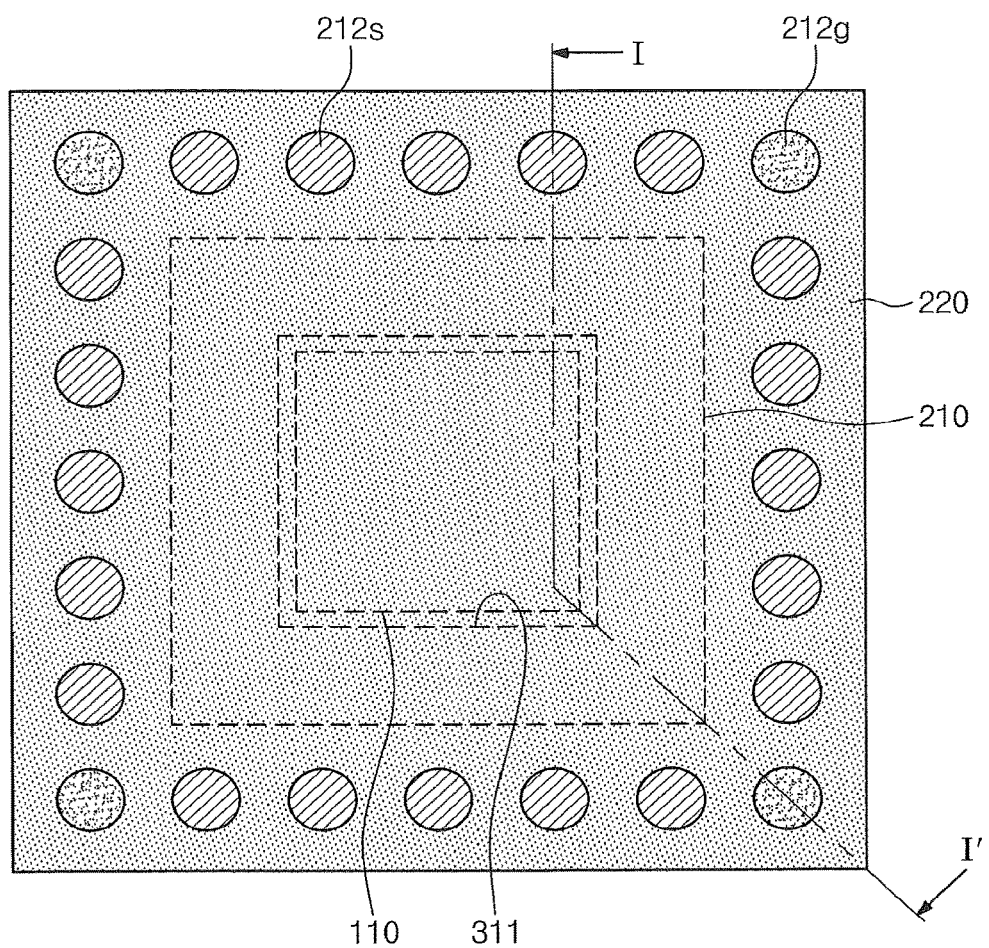
FIG. 1A is a plan view illustrating a semiconductor package according to some embodiments of the inventive concepts.

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in further embodiments without departing from the teachings of the present invention. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Figure 1B:
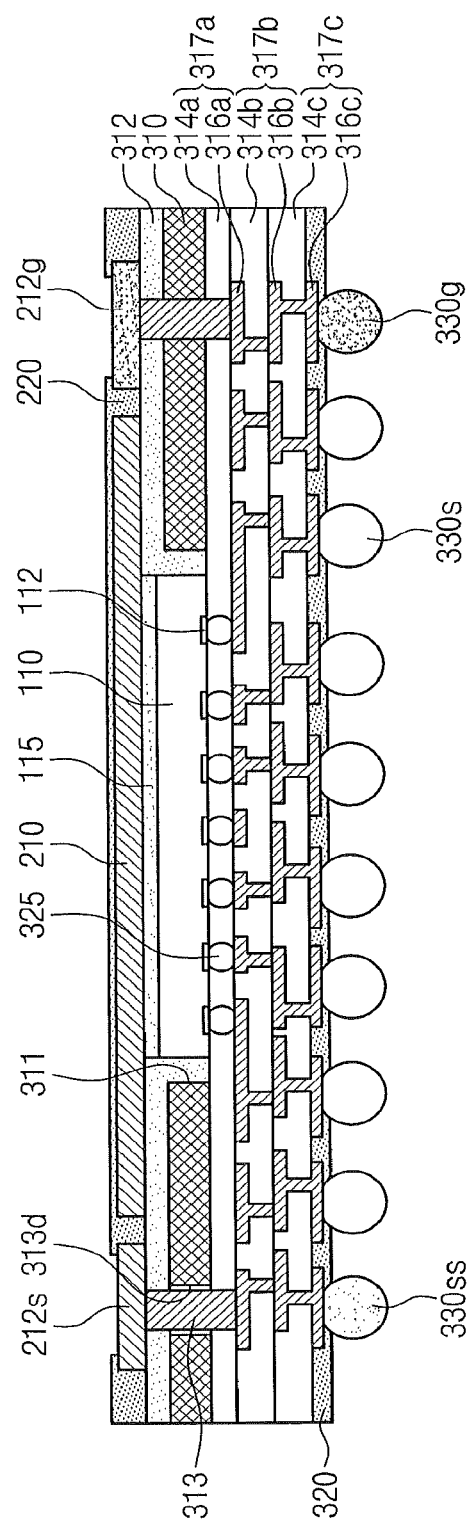
FIG. 1B is a cross-sectional view taken along a line I-I' of FIG. 1A.

FIG. 1A is a plan view illustrating a semiconductor package according to some embodiments of the inventive concepts. FIG. 1B is a cross-sectional view taken along a line I-I' of FIG. 1A.

Referring to FIGS. 1A and 1B, a semiconductor package may include a core plate 310, a semiconductor chip 110 built in the core plate 310, one or more interconnection layers 317a, 317b and 317c disposed on a bottom surface of the core plate 310, a plate-like chip pad 210 covering a portion of a top surface of the core plate 310 and the semiconductor chip 110, and ball pads 212g and 212s disposed on the top surface of the core plate 310.

The core plate 310 may include a through hole 311 where the semiconductor chip 110 is built in. In other words, the semiconductor chip 110 may be disposed in the through hole 311 in a flip chip manner, so that an active surface of the semiconductor chip 110 may be electrically connected to the interconnection layer 317a. The core plate 310 may include a metal material. The core plate 310 may include, for example, at least one of stainless steel, aluminum (Al), nickel (Ni), magnesium (Mg), zinc (Zn), tantalum (Ta), or any combination thereof.

The interconnection layers 317a, 317b, and 317c may be part of a built-up portion of a wiring board. The built-up portion may include a plurality of insulating layers 314a, 314b, and 314c and a plurality of circuit patterns 316a, 316b, and 316c that are alternately provided on the bottom surface of the core plate 310. The insulating layers 314a, 314b, and 314c may include prepreg, an Ajinomoto build-up film (ABF) of Ajinomoto Co., Inc., and/or, for example, epoxy. According to some embodiments of the inventive concepts, first and second insulating layers 314a and 314b of the built-up portion may be Ajinomoto build-up films, and a third insulating layer 314c of the built-up portion may be prepreg.

Bonding pads 112 of the semiconductor chip 110 may be electrically connected to the circuit patterns 316a of the first interconnection layer 317a through mounting connection terminals 325. The semiconductor chip 110 may be mounted on the built-up portion in the flip chip manner and may be built in the through hole 311 of the core plate 310. The semiconductor chip 110 may be, for example, a volatile memory device (e.g., a dynamic random access memory (DRAM) device or a static RAM (SRAM) device), a non-volatile memory device (e.g., a flash memory device), an optoelectronic device, a logic device, a communication device, a digital signal processor (DSP), or a system-on-chip (SoC). In various embodiments, the semiconductor chip 110 may be an optoelectronic device, a logic device, a communication device, a DSP, or and SoC.

The bonding pads 112 of the semiconductor chip 110 may be electrically connected to external connection terminals 330g, 330s, and 330ss through the interconnection layers 317a, 317b, and 317c of the built-up portion. The mounting connection terminals 325 may include, for example, a conductive bump, a solder ball, a conductive spacer, a pin grid array (PGA), or any combination thereof. In some embodiments, the mounting connection thermals 325 may be solder balls.

The external connection terminals 330g, 330s, and 330ss may include a signal connection terminal 330s configured to be electrically connected to an external circuit in order to transmit an electrical signal, a ground connection terminal 330g for grounding, and a stack connection terminal 330ss for electrical connection with another semiconductor package. The external connection terminals 330s, 330g, and 330ss may be include a conductive bump, a solder ball, a conductive spacer, a pin grid array (PGA), or any combination thereof. In some embodiments, the external connection terminals 330s, 330g, and 330ss may be solder balls.

The chip pad 210 may cover the semiconductor chip 110 and a portion of the top surface of the core plate 310 with an adhesive layer 115 therebetween. The chip pad 210 may include a metal material. The chip pad 210 may include, for example, conductive metals such as copper (Cu), nickel (Ni), gold (Au), aluminum (Al) and chromium (Cr), or any combination thereof. In some embodiments of the inventive concepts, the chip pad 210 may include copper. The chip pad 210 may transfer heat generated from the semiconductor chip 110. The adhesive layer 115 may have substantially the same planar extent as the semiconductor chip 110. A side surface of the adhesive layer 115 may be aligned with a side surface of the semiconductor chip 110. The adhesive layer 115 may be, for example, a cure type liquid epoxy or a film type adhesive material. However, inventive concepts are limited thereto.

The ball pads 212g and 212s may be disposed on the top surface of the core plate 310. The ball pads 212g and 212s may be disposed at substantially the same level as the chip pad 210. Additionally, the ball pads 212g and 212s may have substantially the same thickness as the chip pad 210. The ball pads 212g and 212s may include substantially the same material as the chip pad 210. In some embodiments, the ball pads 212g and 212s and the chip pad 210 may be formed by the same process. The ball pads 212g and 212s may include a metal material. The ball pads 212g and 212s may include, for example, conductive metals such as copper (Cu), nickel (Ni), gold (Au), aluminum (Al) and chromium (Cr), or any combination thereof. In some embodiments of the inventive concepts, the ball pads 212g and 212s may include copper.

A planar extent of the chip pad 210 may be greater than the planar extent of the semiconductor chip 110 but may be less than a planar extent of the core plate 310. The chip pad 210 may be surrounded by the ball pads 212g and 212s.

The semiconductor package may further include an upper insulating layer 312 disposed between the chip pad 210 and the ball pads 212g and 212s. The upper insulating layer 312 may include prepreg, an Ajinomoto built-up film (ABF), and/or epoxy. In some embodiments of the inventive concepts, the upper insulating layer 312 may be prepreg. If a planar extent of the through hole 311 of the core plate 310 is greater than the planar extent of the semiconductor chip 110, the upper insulating layer 312 may also be disposed between the core plate 310 and the side surface of the semiconductor chip 110.

The semiconductor package may further include through vias 313 that penetrate the upper insulating layer 312 and the core plate 310 to electrically connect the ball pads 212g and 212s to the circuit patterns 316a of the first interconnection layer 317a of the built-up portion. The through vias 313 may include silver (Ag), gold (Au), copper (Cu), tungsten (W), and/or indium (In).

An air gap 313d may exist between the core plate 310 and the through vias 313. The air gap 313d may prevent a short between the core plate 310 including the metal material and the through via 313 electrically connected to a signal ball pad 212s. In further embodiments, the air gap between the core plate 310 and the through vias 313 may be filled with an insulating material.

Because a short may not occur between the core plate 310 and the through via electrically connected to a ground ball pad 212g, an insulating structure or an insulating material may not be required between the ground ball pad 212g and the core pad 310.

The semiconductor package may further include an upper protection layer 220 covering the chip pad 210 and exposing the ball pads 212g and 212s, and a lower protection layer 320 exposing the circuit pattern 316c of the third interconnection layer 317c of the built-up portion. The upper and lower protection layers 220 and 320 may include, for example, a photo solder resist (PSR).

The ball pads 212g and 212s may be electrically connected to the semiconductor chip 110 and/or the external connection terminals 330g, 330s, and 330ss through the circuit patterns 316a, 316b, and 316c of the interconnection layers 317a, 317b, and 317c of the built-up portion. The ball pads 212g and 212s may include the signal ball pad 212s electrically connected to the semiconductor chip 110 and/or the signal external connection terminal 330s in order to transmit the electrical signal, and the ground ball pad 212g for grounding.

Since the ground external connection terminal 330s is electrically connected to the ground ball pad 212g, the semiconductor chip 110 may be effectively shielded.

Stack terminals (see FIG. 4) for electrical connection with an additional stacked semiconductor package may be provided on the ball pads 212g and 212s exposed by the upper protection layer 220. The external connection terminals 330g, 330s, and 330ss may be provided on the circuit patterns 316c of the third interconnection layer 317c that are exposed by the lower protection layer 320.

Figure 2A:
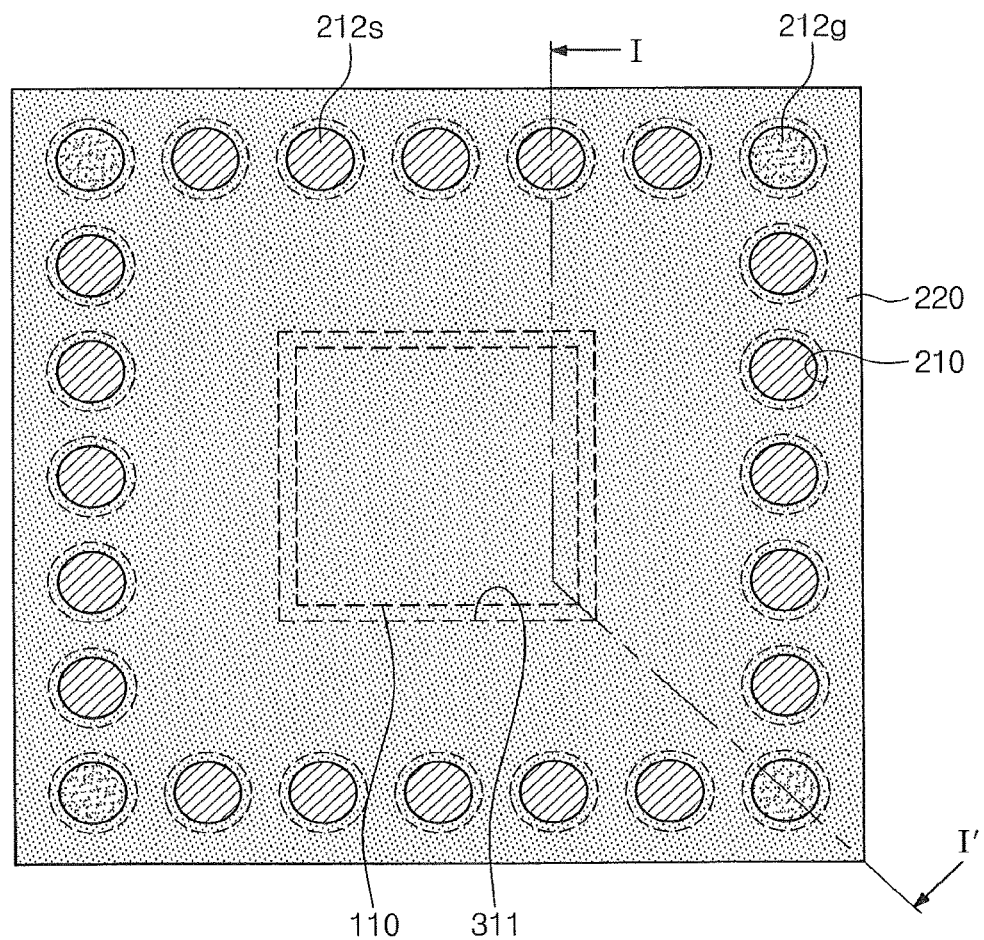
FIG. 2A is a plan view illustrating a semiconductor package according to further embodiments of the inventive concepts.
Figure 2B:
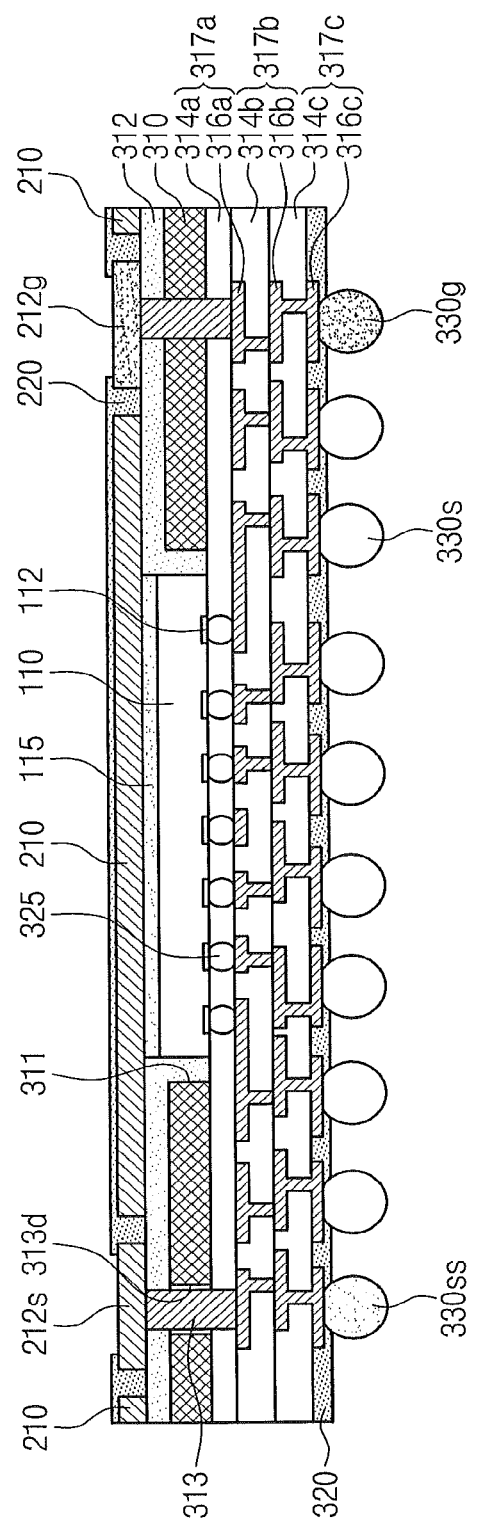
FIG. 2B is a cross-sectional view taken along a line I-I' of FIG. 2A.

Hereinafter, a semiconductor package according to further embodiments of the inventive concepts will be described with reference to FIGS. 2A and 2B. FIG. 2A is a plan view illustrating a semiconductor package according to further embodiments of the inventive concepts, and FIG. 2B is a cross-sectional view taken along a line I-I' of FIG. 2A. In the present embodiments, like elements as described with reference to the aforementioned embodiments of the inventive concepts will be indicated by the same reference numerals or the same reference designators.

The semiconductor package according to the present embodiments of FIGS. 2A and 2B includes a chip pad 210 having a different structure from that of the semiconductor package according to the aforementioned embodiments of FIGS. 1A and 1B.

A chip pad 210 may have substantially the same planar extent as the core plate 310. In other words, ball pads 212g and 212s may take the form of island-like structures surrounded by the chip pad 210.

The chip pad 210 may include a metal material. The chip pad 210 may include, for example, conductive metals such as copper (Cu), nickel (Ni), gold (Au), aluminum (Al) and chromium (Cr), or combinations thereof. In some embodiments of the inventive concepts, the chip pad 210 may include copper (Cu).

Figure 3A:
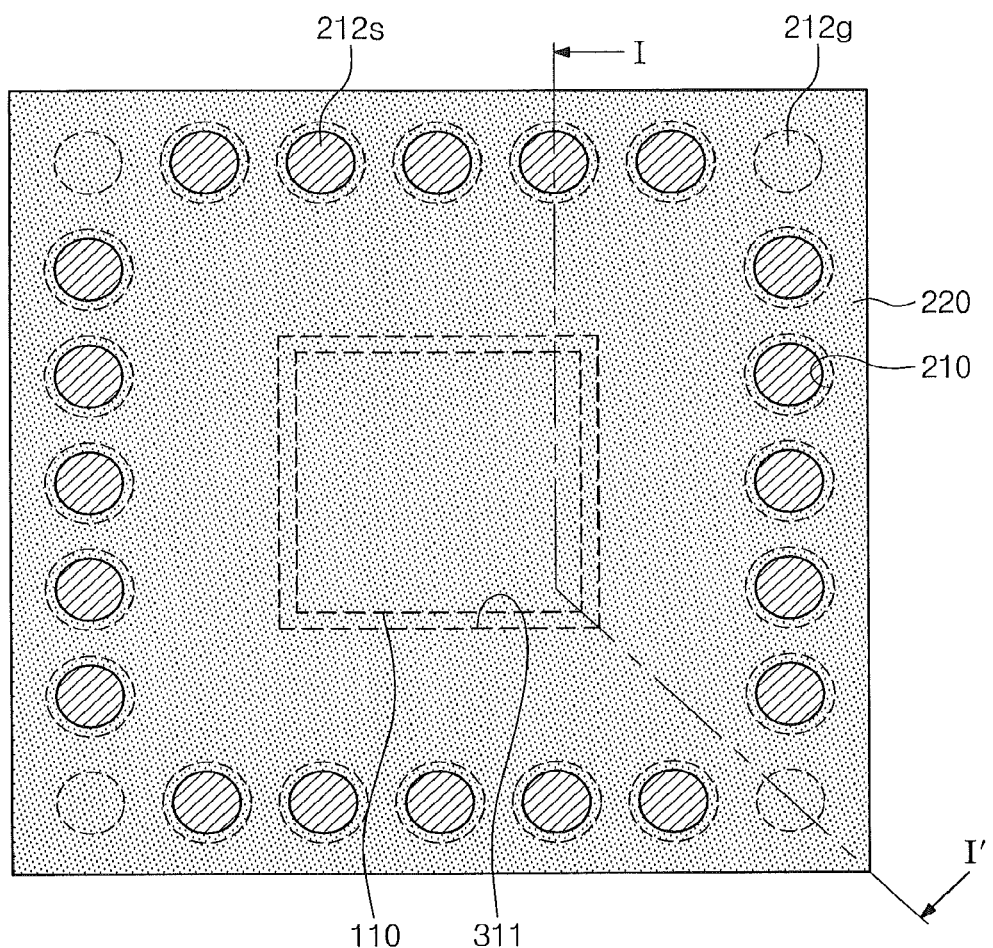
FIG. 3A is a plan view illustrating a semiconductor package according to still further embodiments of the inventive concepts.
Figure 3B:
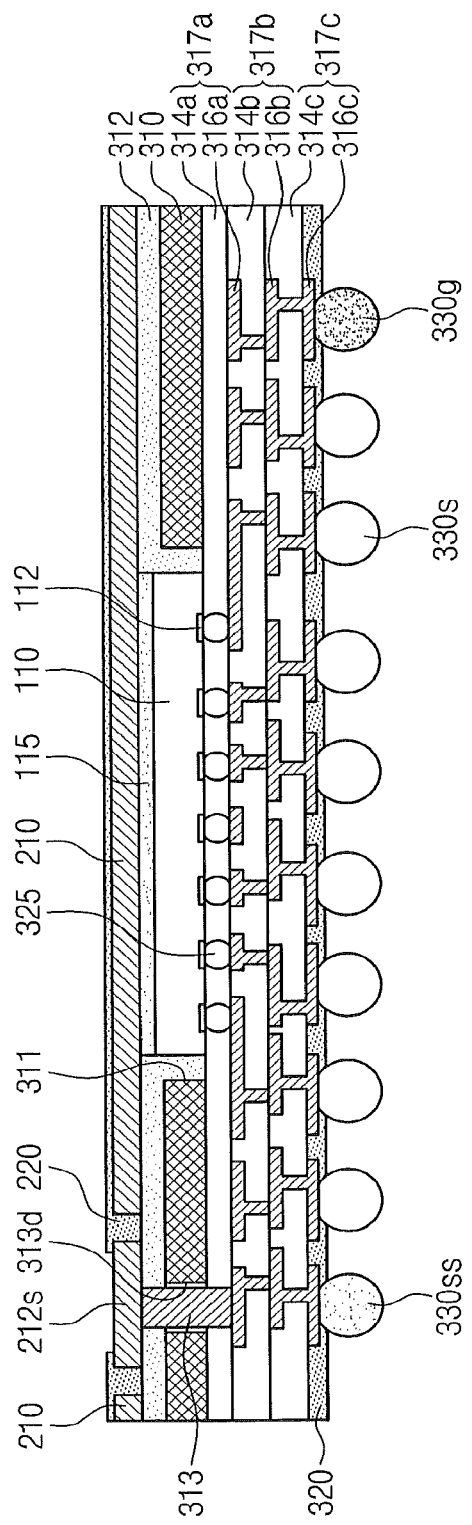
FIG. 3B is a cross-sectional view taken along a line I-I' of FIG. 3A.

Hereinafter, a semiconductor package according to still further embodiments of the inventive concepts will be described with reference to FIGS. 3A and 3B. FIG. 3A is a plan view illustrating a semiconductor package according to still further embodiments of the inventive concepts, and FIG. 3B is a cross-sectional view taken along a line I-I' of FIG. 3A. In the present embodiments, like elements as those described in the aforementioned embodiments of the inventive concepts will be indicated by the same reference numerals or the same reference designators.

The semiconductor package according to the present embodiments of FIGS. 3A and 3B includes a chip pad 210 having a different structure from that of the semiconductor package according to the aforementioned embodiment of FIGS. 1A and 1B.

A chip pad 210 may have substantially the same planar extent as the core plate 310. Signal ball pad 212s of ball pads 212g and 212s may have an island-like structure surrounded by the chip pad 210, but a ground ball pad 212g may be connected to the chip pad 210.

The chip pad 210 may include a metal material. The chip pad 210 may include, for example, conductive metals such as copper (Cu), nickel (Ni), gold (Au), aluminum (Al) and chromium (Cr), or combinations thereof. In some embodiments of the inventive concepts, the chip pad 210 may include copper (Cu).

A semiconductor package according to some embodiments of the inventive concepts includes the semiconductor chip 110 built in the through hole 311 of the core plate 310, such that a total thickness of the core plate 310 and the semiconductor chip 110 may be reduced. Thus, a thin semiconductor package may be provided.

Additionally, a semiconductor package according to some embodiments of the inventive concepts may include a structure shielding the semiconductor chip 110 built in the core plate 310. Thus, a semiconductor package with improved reliability may be provided.

Moreover, a semiconductor package according to some embodiments of the inventive concepts may have a chip pad 210 adjacent to the semiconductor chip 110, so that the heat generated from the semiconductor chip 110 may be more readily transferred. Thus, a semiconductor package with improved reliability may be provided.

Figure 4:
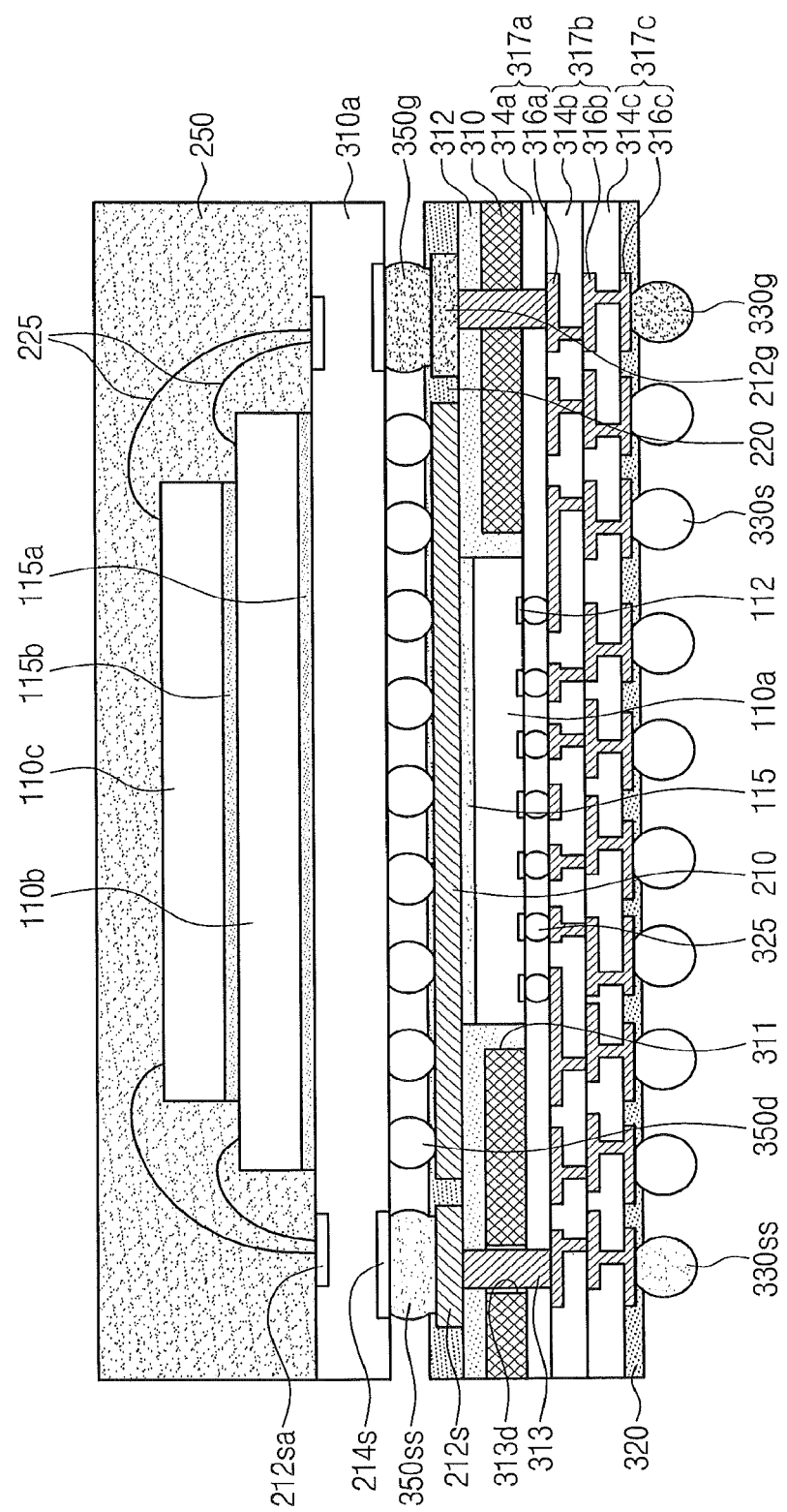
FIG. 4 is a cross-sectional view illustrating a semiconductor package according to yet further embodiments of the inventive concepts.

Hereinafter, a semiconductor package according to yet further embodiments of the inventive concepts will be described with reference to FIG. 4. FIG. 4 is a cross-sectional view illustrating a semiconductor package according to yet further embodiments of the inventive concepts. In the present embodiment, like elements as described in the aforementioned embodiments of the inventive concepts will be indicated by the same reference numerals or the same reference designators.

The semiconductor package according to the present embodiments of FIG. 4 includes a package-on-package (PoP) structure further including stacked semiconductor packages. Stack terminals 350g and 350ss may be provided on the ball pads 212g and 212s of a lower package. The stack terminals 350g and 350ss may include a signal stack terminal 350ss electrically connecting the lower package to an upper package in order to transmit an electrical signal, and a ground stack terminal 350g for grounding.

The upper package may include a wiring board 310a and at least one second semiconductor chip 110b and/or 110c mounted on a top surface of the wiring board 310a. The second semiconductor chips 110b and 110c may be mounted on the wiring board 310a using second adhesive layers 115a and 115b and bonding wires 225 in a wire bonding manner. Thus, the second semiconductor chips 110b and 110c may be electrically connected to the wiring board 310a. However, the inventive concepts are not limited thereto. The second adhesive layers 115a and 115b may include, for example, a cure type liquid epoxy or a film type adhesive material. However, inventive concepts are not limited thereto.

The wiring board 310*a* may include upper connection pads 212*sa* on its top surface and lower connection pads 214*s* on its bottom surface. The upper and lower connection pads 212*sa* and 214*s* may be connected to a circuit pattern in the wiring board 310*a*. The wiring board 310 may be, for example, a printed circuit board (PCB). The inventive concepts are not limited thereto.

The upper package may further may include a molded layer 250 covering the top surface of the wiring 310*a*, the second semiconductor chips 110*b* and 110*c* and the bonding wires 225. The molded layer 250 may include an epoxy molding compound (EMC), however, may not be limited thereto. A side surface of the molded layer 250 is illustrated to be coplanar with a side surface of the wiring board 310*a*. However, the inventive concepts are not limited thereto. In other words, the molded layer 250 may have an inclined side surface with respect to the top surface of the wiring board 310*a*.

The ball pads 212*g* and 212*s* of the lower package may be electrically connected to the lower connection pads 214*s* of the wiring board 310*a* of the upper package through the stack terminals 350*g* and 350*ss*. Thus, a first semiconductor chip 110*a* of the lower package may be electrically connected to the second semiconductor chips 110*b* and 110*c* of the upper package. The lower and upper packages may have substantially the same planar extent or different planar extents. Each of the stack terminals 350*g* and 350*ss* may be one selected from a group consisting of a conductive bump, a solder ball, a conductive spacer, a pin grid array (PGA), and any combination thereof. In some embodiments, the stack terminals 350*g* and 350*ss* according to some embodiments of the inventive concepts may be solder balls.

Dummy terminals 350*d* may be provided between the chip pad 210 of the lower package and the bottom surface of the wiring board 310*a* of the upper package. The dummy terminals 350*d* may include, for example, a conductive bump, a solder ball, a conductive spacer, a pin grid array (PGA), or combinations thereof. In some embodiments, the dummy terminals 350*d* may be solder balls. The dummy terminals 350*d* may transfer heat from the first semiconductor chip 110*a*. Thus, the heat generated by the first semiconductor chip 110*a* may be more easily transferred through the chip pad 210 and the dummy terminals 350*d*.

The first semiconductor chip 110*a* and the second semiconductor chips 110*b* and/or 110*c* may perform different functions. The first semiconductor chip 110*a* and the second semiconductor chips 110*b* and/or 110*c* may be, for example, a volatile memory device (e.g., a DRAM device or a SRAM device), a non-volatile memory device (e.g., a flash memory device), an optoelectronic device, a logic device, a communication device, a digital signal processor (DSP), and/or a system-on-chip (SoC).

The semiconductor package according to the present embodiments includes the first semiconductor chip 110*a* built in the through hole 311 of the core plate 310, such that a total thickness of the core plate 310 and the first semiconductor chip 110*a* may be reduced. Thus, a thin semiconductor package may be provided.

Additionally, the semiconductor package according to the present embodiments has the structure shielding the first semiconductor chip 110*a* built in the core plate 310. As a result, a semiconductor package with improved reliability may be provided.

The semiconductor package according to the present embodiments also has the chip pad 210 adjacent to the first semiconductor chip 110*a*, so that heat generated by the first semiconductor chip 110*a* may be easily transferred. Thus, a semiconductor package with improved reliability may be provided.

Figure 5:
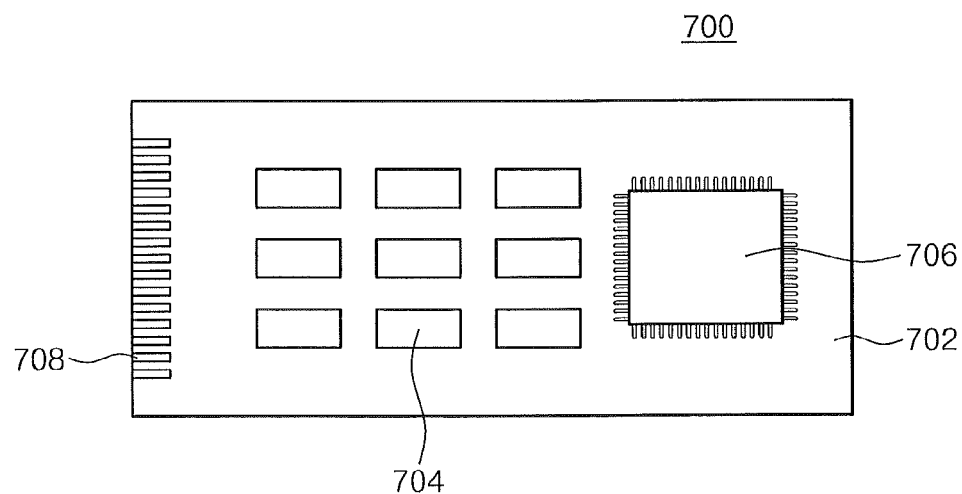
FIG. 5 is a plan view illustrating a package module according to some embodiments of the inventive concepts.

FIG. 5 is a plan view illustrating a package module according to some embodiments of the inventive concepts.

Referring to FIG. 5, a package module 700 may include a module board 702 having external connection terminals 708, and a semiconductor chip 704 and a quad flat package (QFP) type a semiconductor package 706 mounted on the module board 702. The semiconductor package 706 may include, for example, a semiconductor package according to some embodiments of the inventive concepts. The package module 700 may be connected to an external electronic device through the external connection terminals 708.

Figure 6:
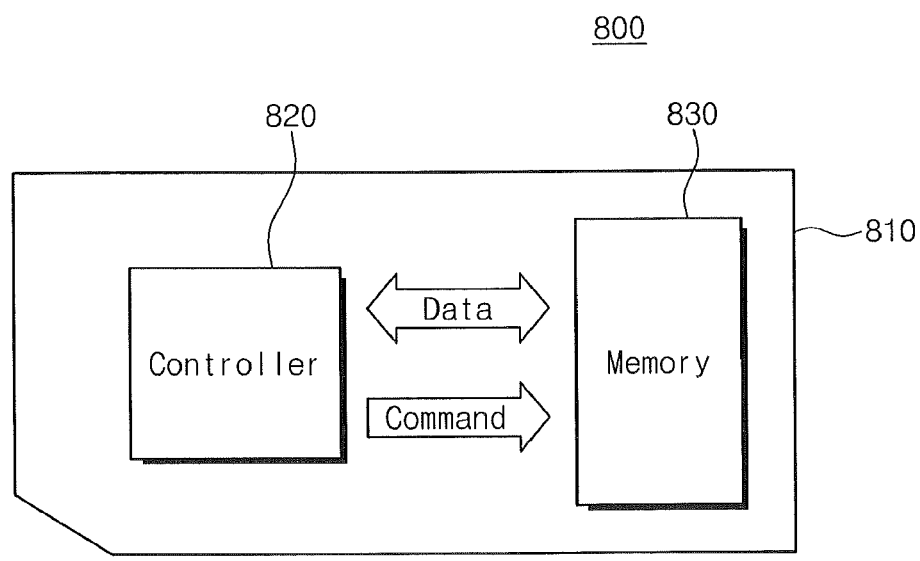
FIG. 6 is a schematic block diagram illustrating a memory card according to some embodiments of the inventive concepts.

FIG. 6 is a schematic block diagram illustrating a memory card according to some embodiments of the inventive concepts.

Referring to FIG. 6, a memory card 800 may include a controller 820 and a memory device 830 in a housing 810. The controller 820 may exchange electrical signals with the memory device 830. For example, the controller 820 and the memory device 830 may exchange data with each other in response to commands of the controller 820. Thus, the memory card 800 may store data in the memory device 830 or may output data from the memory device 830 to an external system.

The controller 820 and/or the memory device 830 may include at least one of the semiconductor packages according to the aforementioned embodiments of the inventive concept. For example, the controller 820 may include a system-in-package, and the memory device 830 may include a multi-chip package. Alternatively, the controller 820 and/or the memory device 830 may be a stack type package. The memory card 800 may be used as a data storage medium of various portable devices. For example, the memory card 800 may include a multimedia card (MMC) or a secure digital (SD) card.

Figure 7:
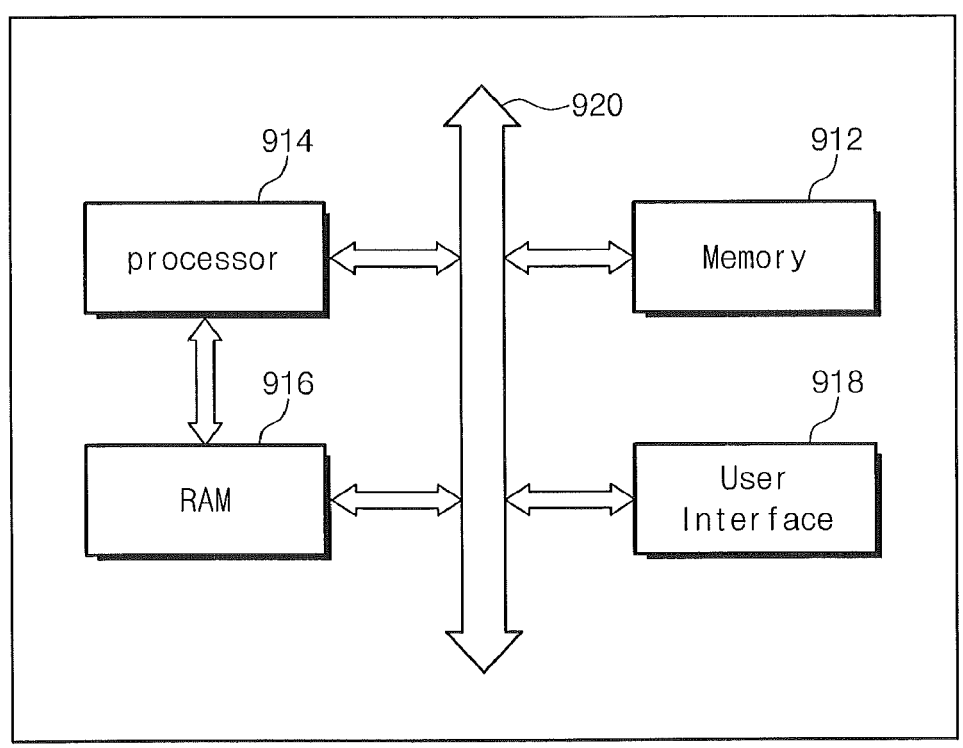
FIG. 7 is a schematic block diagram illustrating an electronic system according to some embodiments of the inventive concepts.

FIG. 7 is a schematic block diagram illustrating an electronic system according to some embodiments of the inventive concepts.

Referring to FIG. 7, an electronic system 900 may include at least one of the semiconductor packages according to the aforementioned embodiments of the inventive concept. The electronic system 900 may include a mobile device or a computer. For example, the electronic system 900 may include a memory system 912, a processer 914, a random access memory (RAM) device 916, and a user interface unit 918. The memory system 912, the processor 914, the RAM device 916, and the user interface unit 918 may communicate with each other through the data bus 920. The processor 914 may execute a program and may control the electronic system 900. The RAM device 916 may be used as an operation memory of the processor 914. For example, each of the processor 914 and the RAM device 916 may include the semiconductor package according to the aforementioned embodiments of the inventive concept. Alternatively, the processor 914 and the RAM device 916 may be included in one package. The user interface unit 918 may be used in order to input data in or in order to output data from the electronic system 900. The memory system 912 may store a coder for operation of the processor 914, data processed by the processor 914, or data inputted from an external system. The memory system 912 may include a controller and a memory device. The memory system 912 may include substantially the same structure as the memory card 800 of FIG. 6.

Figure 8:
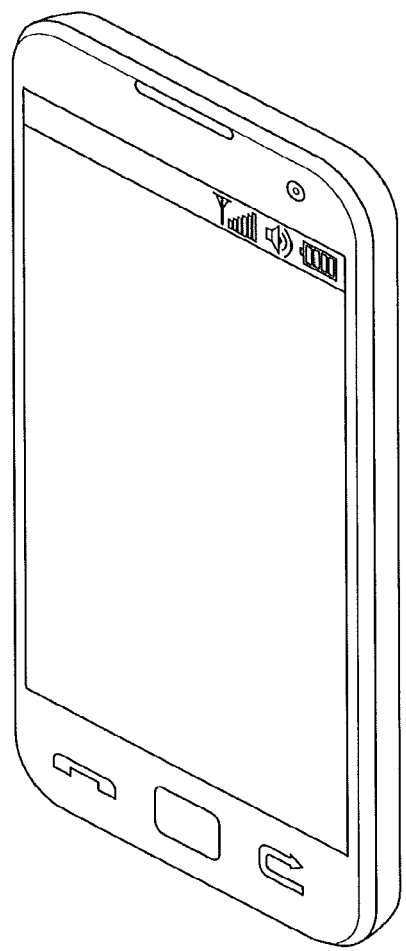
FIG. 8 is a perspective view of an electronic device according to some embodiments of the inventive concepts.

The electronic system 900 of FIG. 7 may be applied to electronic control devices of various electronic devices. FIG. 8 illustrates a mobile phone 1000 applied with the electronic system 900 of FIG. 7. In further embodiments, the electronic system 900 of FIG. 7 may be applied to a portable notebook, a MP3 player, a navigation device, a solid state disk (SSD), a car, or a household appliance.

As described above, semiconductor packages according to some embodiments of the inventive concepts include semiconductor chips built in a through hole of a core plate, such that a total thickness of the core plate and the semiconductor chip may be reduced. Thus, a thin semiconductor package may be provided.

Additionally, semiconductor packages according to some embodiments of the inventive concepts may have a structure shielding the semiconductor chip built in the core plate. Thus, a semiconductor package with improved reliability may be provided.

Semiconductor packages according to some embodiments of the inventive concepts include a chip pad adjacent to the semiconductor chip, so that heat generated by the semiconductor chip may be more easily transferred. Thus, a semiconductor package with improved reliability may be provided.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor package comprising:
a core having a through hole therein;
at least one interconnection layer disposed on a first surface of the core;
at least one semiconductor chip disposed on the at least one interconnection layer in a space defined by the through hole and electrically connected to the at least one interconnection layer;
a conductive layer extending continuously across an entire length of the at least one semiconductor chip and disposed on the at least one semiconductor chip such that the at least one semiconductor chip is disposed between the at least one interconnection layer and the conductive layer, wherein the conductive layer is electrically insulated from the core; and
at least one conductive pad disposed on a second surface of the core and electrically connected to the at least one interconnection layer; and
an adhesive layer extending continuously across the entire length of the at least one semiconductor chip and attaching the at least one semiconductor chip directly to the conductive layer.

2. The semiconductor package of claim 1, wherein the at least one semiconductor chip comprises at least one bonding pad electrically connected to the at least one interconnection layer and provided at a surface of the at least one semiconductor chip that is opposite to another surface of the at least one semiconductor chip, and
wherein the another surface of the at least one semiconductor chip is attached to the conductive layer via the adhesive layer.

3. The semiconductor package of claim 1, further comprising a first insulating layer provided on the second surface of the core, wherein the first insulating layer is provided between the core and the conductive layer and between the core and the at least one semiconductor chip.

4. The semiconductor package of claim 3, wherein the first insulating layer includes an Ajinomoto built-up film (ABF).

5. The semiconductor package of claim 3, further comprising a first protection layer disposed on the first insulating layer and at least partially exposing the at least one conductive pad.

6. The semiconductor package of claim 5, further comprising a second protection layer disposed on a surface of the at least one interconnection layer, the surface of the at least one interconnection layer being opposite to another surface of the at least one interconnection layer on which the at least one semiconductor chip is disposed.

7. The semiconductor package of claim 3, wherein the at least one interconnection layer comprises at least one second insulating layer and at least one circuit pattern.

8. The semiconductor package of claim 1, the core includes metal material.

9. A semiconductor package comprising:
a core having a through hole therein;
at least one interconnection layer disposed on a first surface of the core;
at least one semiconductor chip disposed on the at least one interconnection layer in a space defined by the through hole and electrically connected to the at least one interconnection layer;
a conductive layer extending continuously across an entire length of the at least one semiconductor chip and disposed on the at least one semiconductor chip such that the at least one semiconductor chip is disposed between the at least one interconnection layer and the conductive layer, wherein the conductive layer is electrically insulated from the core;
a first insulating layer disposed on the conductive layer and extending continuously across the entire length of the at least one semiconductor chip;
at least one conductive pad disposed on a second surface of the core and electrically connected to the at least one interconnection layer; and
an adhesive layer extending continuously across the entire length of the at least one semiconductor chip and attaching the at least one semiconductor chip directly to the conductive layer.

10. The semiconductor package of claim 9, wherein the first insulating layer is a dielectric layer.

11. The semiconductor package of claim 9, further comprising a second insulating layer provided on the second surface of the core, wherein the second insulating layer is provided between the core and the conductive layer and between the core and the at least one semiconductor chip.

12. The semiconductor package of claim 11, wherein the second insulating layer includes an Ajinomoto built-up film (ABF).

13. The semiconductor package of claim 9, further comprising a protection layer disposed on a surface the at least one interconnection layer, the surface of the at least one interconnection layer being opposite to another surface of the at least one interconnection layer on which the at least one semiconductor chip is disposed.

14. The semiconductor package of claim 9, wherein the at least one semiconductor chip comprises at least one bonding pad electrically connected to the at least one interconnection layer and provided at a surface of the at least one semiconductor chip that is opposite to another surface of the at least one semiconductor chip, and wherein the another surface of the at least one semiconductor chip is attached to the conductive layer via the adhesive layer.

15. A semiconductor package comprising:
a core having a through hole therein;
at least one interconnection layer disposed on a first surface of the core;
at least one semiconductor chip disposed on the at least one interconnection layer in a space defined by the through hole and electrically connected to the at least one interconnection layer;
a conductive layer extending continuously across an entire length of the at least one semiconductor chip and disposed on the at least one semiconductor chip such that the at least one semiconductor chip is disposed between the at least one interconnection layer and the conductive layer; and
a first insulating layer provided on a second surface of the core, wherein the first insulating layer is provided between the core and the conductive layer so that the conductive layer is electrically insulated from the core, and the first insulating layer is provided between the core and the at least one semiconductor chip; and
an adhesive layer extending continuously across the entire length of the at least one semiconductor chip and attaching the at least one semiconductor chip directly to the conductive layer.

16. The semiconductor package of claim 15, wherein the first insulating layer includes an Ajinomoto built-up film (ABF).

17. The semiconductor package of claim 15, wherein the at least one semiconductor chip comprises at least one bonding pad electrically connected to the at least one interconnection layer and provided at a surface of the at least one semiconductor chip that is opposite to another surface of the at least one semiconductor chip, and wherein the another surface of the at least one semiconductor chip is attached to the conductive layer via the adhesive layer.

18. The semiconductor package of claim 15, further comprising at least one conductive pad disposed on the second surface of the core and electrically connected to the at least one interconnection layer.

19. The semiconductor package of claim 18, further comprising a first protection layer disposed on the first insulating layer and at least partially exposing the at least one conductive pad.

20. The semiconductor package of claim 19, further comprising a second protection layer disposed on a surface the at least one interconnection layer, the first surface of the at least one interconnection layer being opposite to another surface of the at least one interconnection layer on which the at least one semiconductor chip is disposed.

* * * * *